US009547238B2

(12) United States Patent
Pavel

(10) Patent No.: US 9,547,238 B2
(45) Date of Patent: Jan. 17, 2017

(54) PHOTORESIST WITH RARE-EARTH SENSITIZERS

(71) Applicant: Eugen Pavel, Bucharest (RO)

(72) Inventor: Eugen Pavel, Bucharest (RO)

(*) Notice: Subject to any disclaimer, the term of this patent is extended or adjusted under 35 U.S.C. 154(b) by 0 days.

(21) Appl. No.: 14/413,255

(22) PCT Filed: Feb. 19, 2013

(86) PCT No.: PCT/RO2013/000003
§ 371 (c)(1),
(2) Date: Jan. 7, 2015

(87) PCT Pub. No.: WO2013/119134
PCT Pub. Date: Aug. 15, 2013

(65) Prior Publication Data
US 2015/0132700 A1  May 14, 2015

(30) Foreign Application Priority Data
Oct. 16, 2012  (RO) .............................. A2012 00733

(51) Int. Cl.
*G03F 7/004* (2006.01)
*G03F 7/028* (2006.01)
*G03F 7/039* (2006.01)
*G03F 7/20* (2006.01)
*B23K 26/00* (2014.01)
*G03F 7/038* (2006.01)

(52) U.S. Cl.
CPC .......... *G03F 7/0042* (2013.01); *B23K 26/0066* (2013.01); *G03F 7/0384* (2013.01); *G03F 7/2053* (2013.01)

(58) Field of Classification Search
CPC ........... G03F 7/004; G03F 7/039; G03F 7/028
See application file for complete search history.

(56) References Cited

U.S. PATENT DOCUMENTS

| | | | |
|---|---|---|---|
| 3,196,098 A | 7/1965 | Mochel | |
| 3,341,328 A | 9/1967 | Schwerin et al. | |
| 3,615,629 A | 10/1971 | Wilhelm et al. | |
| 4,180,640 A * | 12/1979 | Melody et al. | 526/323.1 |
| 5,128,232 A | 7/1992 | Thackeray et al. | |
| 5,225,312 A | 7/1993 | Dixit et al. | |
| 5,492,790 A | 2/1996 | Hishiro | |
| 5,976,770 A | 11/1999 | Sinta et al. | |
| 6,087,413 A * | 7/2000 | Lake | C08F 2/50 522/74 |
| 6,376,150 B1 | 4/2002 | Bolli et al. | |
| 7,491,419 B2 * | 2/2009 | Stropp | B05D 3/067 427/140 |
| 2002/0012873 A1* | 1/2002 | Jung et al. | 430/270.1 |
| 2003/0139484 A1* | 7/2003 | Bentsen et al. | 522/2 |
| 2003/0194641 A1* | 10/2003 | Mizutani et al. | 430/270.1 |
| 2004/0185372 A1* | 9/2004 | Takakuwa | 430/270.1 |
| 2004/0202956 A1* | 10/2004 | Takahashi | C09K 3/10 430/270.1 |
| 2004/0259008 A1 | 12/2004 | Endo et al. | |
| 2006/0153990 A1* | 7/2006 | Levey et al. | 427/402 |

FOREIGN PATENT DOCUMENTS

| | | |
|---|---|---|
| EP | 1734074 A1 | 12/2006 |
| WO | WO 03/058346 A1 | 7/2003 |

OTHER PUBLICATIONS

Bonzanini, R., Girotto, E.M., Goncalves, M.C., Radovanovic, E., Muniz, E.C., Rubira, A. F.-Effects of europium (III) acetylacetonate doping on the miscibility and photoluminescent properties of polycarbonate and poly(methyl methacrylate) blends, www.sciencedirect.com, available online Nov. 19, 2004.*
Sigma-Aldrich Europium (III) acetylacetonate hydrate, Sigma-Aldrich, 2016.*
D.M. Eigler, et al; Positioning single atoms with as scanning tunnelling microscope; Nature, vol. 344; 1990; pp. 524-526.
C.R. Moon, et al; Quantum holographic encoding in a two-dimensional . . . ; Nature Nanotechnology; vol. 4; 2009; pp. 167-172.
S. Yasin, et al; Fabrication of <5 nm width lines in poly (methylmethacrylate) resist . . . ; Applied Physics Letters; vol. 78; No. 18; 2001; pp. 2760-2762.
A. Muray, et al; Radiolysis and resolution limits of inorganic halide resists; Journ. Vacuum Science and Technology; vol. B 3; No. 1; 1985; pp. 367-372.
S.W. Hell, et al; Breaking the diffraction resolution limit by stimulated . . . ; Optics Letters; vol. 19; No. 11; 1994; pp. 780-782.
T.L. Andrew, et al; Confining light to deep subwavelength dimensions to enable . . . ; Science; vol. 324; 2009; pp. 917-921.
T.F. Scott, et al; Two-color single-photon Photoinitiation and photoinhibition . . . ; Science; vol. 324; 2009; pp. 913-917.
L. Li, et al; Achieving lamda/20 resolution by one-color initiation and deactivation . . . ; Science vol. 324; 2009; pp. 910-913.
J. Fisher, et al; Three-dimensional direct laser writing inspired by . . . ; Optical Materials Express; vol. 1; No. 4; 2011; pp. 614-624.
E. Pavel, et al; 5 nm structures produced by direct laser writing; Nanotechnology; vol. 22; No. 2; 2011; 025301; pp. 1-6.
E. Pavel, et al; 2 nm Quantum optical lithography; Optics Communications; vol. 291; 2013; pp. 259-263.
E. Pavel, et al; Quantum optical lithography from 1 nm resolution to pattern . . . ; Opt. Laser Technol.; vol. 60; 2014; pp. 80-84.
A.N. Boto, et al; Interferometric optical lithography: exploiting entanglement . . . ; Phys. Rev. Lett.; vol. 85; No. 13; 2000; pp. 2733-2736.
W.F. Van Dorp, et al; Growth behavior near the ultimate resolution of . . . ; Nanotechnology; vol. 19; No. 22; 2008; 225305; pp. 1-9.

\* cited by examiner

*Primary Examiner* — Anca Eoff
(74) *Attorney, Agent, or Firm* — Lucas & Mercanti, LLP; Jonathan Myers

(57) ABSTRACT

A method of making a photoresist with rare-earth sensitizers is provided. The rare-earth sensitizer could be a salt or a rare-earth complex. According to the invention, photoresist composition is useful to pattern circuits by visible light.

18 Claims, No Drawings

PHOTORESIST WITH RARE-EARTH SENSITIZERS

CROSS REFERENCE TO RELATED APPLICATION

This Application is a 371 of PCT/RO2013/000003 filed on Feb. 19, 2013 which, in turn, claimed the priority of Romanian Patent Application No. a2012 00733 filed on Oct. 16, 2012 both applications are incorporated herein by reference.

BACKGROUND OF THE INVENTION

1. Field of the Invention

The invention relates generally to the fields of semiconductor fabrication, lithography, and polymer chemistry. More particularly, the invention relates to rare-earth photoresist compositions and a method of making the same. The product is suitable for use in visible light lithography.

2. Description of the Related Art

In the manufacture of patterned devices, such as semiconductor chips and packaging applications, the process of etching different layers which constitute the finished product is among the most crucial steps involved. One method widely employed in the etching process is to overlay the surface to be etched with a suitable photoresist, and then to immerse the substrate and photoresist in a chemical solution which attacks the substrate to be etched while leaving the photoresist intact. There are two types of photoresists: i) a positive resist is one which on exposure to imaging light is capable of being rendered soluble in a solvent in which the unexposed resist is not soluble, ii) a negative resist is one which is capable of polymerizing and/or insolubilizing upon exposure to imaging light. Typically, the exposing light for an UV photoresist, is a mercury vapor source emitting a broadband emission in the ultraviolet region which comprises of G line at 436 nm, H line at 405 nm and I line at 365 nm. Generally, the major output wavelength of the source is an I line at 365 nm. Recent research in the field of lithography is oriented towards the search for photoresist compositions that are sensitive to laser light. Deep-UV (DUV) lithography uses 248 nm and 193 nm exposure wavelengths supplied by KrF and ArF excimer lasers. Extreme ultraviolet (EUV) lithography, working at 13.5 nm with soft X-ray plasma sources, is under development. Dedicated photoresists for each wavelength have been devised. Examples of conventional resins for photoresists are phenol resins in which a part or the whole of hydroxyl groups are protected by groups such acetal or ketal (KrF photoresist), methacrylic acid resins in which an acid-labile ester group is introduced to carboxyl group (ArF photoresist) and the like.

The photosensitivity of photoresists is brought up to a practical value by addition of photosensitizers. U.S. Pat. No. 5,225,312 to Dixit et al. discloses a positive photoresist with coumarin dyes. In addition, examples of some photoresists with other organic dyes are provided in U.S. Pat. Nos. 6,376,150 to Bolli et al.; 5,976,770 to Sinta et al.; 5,128,232 to Thackeray et al.; and 5,492,790 to Hishiro.

E. Pavel et al. has published in *Optics Communications* 291 (2013) 259-263 a method describing "2 nm Quantum Optical Lithography" by application of quantum multiphoton confinement effect in fluorescent photosensitive glass-ceramics containing rare-earths. The breaking of the diffraction limit was possible by using novel materials such as fluorescent photosensitive glass-ceramics.

The benefit of the present invention is the replacement of high intensity light sources with low power laser diodes.

The object of the present invention is to provide a photoresist with improved sensitivity to visible light. In order to accomplish this object, there is provided a composition which contains rare-earth (RE) compounds.

It is believed, therefore, that a new photoresist composition will represent a significant advancement in the art.

SUMMARY OF THE INVENTION

The present invention relates to an optical nano-lithography system comprising a photoresist having a quantum multi-photon confinement effect and at least one laser beam directed to the photoresist and adapted to write patterns in the photoresist.

The present invention also relates to a composition of photoresist used in visible light lithography and a method to produce the same.

Typically, the visible radiation has a wavelength between about 450 nm and 780 nm.

The invention described here is based on fundamentally different dyes (rare-earth compounds) from conventional photoresists. Organic dyes have broad absoption bands in visible spectrum, while rare-earth ions have narrow absorption lines. This property makes lasers more efficient in light exposing of photoresists containing a rare-earth compound.

Generally, the composition of the invention may also contain a mixture of rare-earth compounds.

According to another aspect of the present invention, a method for producing a photoresist with rare-earth sensitizers is provided. The method includes the steps of:
dissolving an UV/DUV/EUV photoresist in an organic solvent;
adding and mixing a quantity of rare-earth compound soluble to the above solution; and
casting films.

Doping a photoresist with RE-ions requires a certain solubility which can be achieved by choosing suitable organic solvents.

One of the most pronounced advantages of encapsulating the RE ions as a sensitizer is the ability to control the manifold of electronic excited states. The energy transfer between RE ions and surrounding organic ligands can approach unity efficiency in rare-earth complexes.

According to the present invention, there is a further method for producing photoresists in which the rare-earth compounds (salts or/and complexes) will be incorporate directly from the monomer. RE-compounds should have enough thermal stability to survive the polymerization process. In this way, RE-compounds can be incorporated into the photoresist without any need for solvents.

DETAILED DESCRIPTION OF THE PREFERRED EMBODIMENTS

The present invention is described in further detail in the following examples which are given for illustrative purposes only. A method to produce a photoresist with rare-earth sensitizers consists in mixing two solutions with a single component (UV/DUV/EUV photoresist or rare-earth compound) soluble in the same organic solvent. Any solvents which are not photoreactive and which dissolve both components can be used in this invention.

Positive photoresists comprising an alkali-soluble novolac resin and a quinone diazide as a sensitizer are well known in the art. It is generally the case that the novolac resin and quinone diazide are dissolved in an organic solvent. Suitable solvents include, but are not limited to acetone, methyl ethyl ketone, cyclohexanone, benzene, chlorobenzene, toluene, glycol ethers, isopropyl alcohol, ethanol and methanol. These solvents can be used individually or as mixtures thereof.

A different way to incorporate rare-earth ions in photoresists is the encapsulation of the ions by complexation with organic ligands.

EXAMPLE 1

A novolac resin/quinone diazide type photoresist and Eu naphthenate are dissolved separately in acetone. Both solutions were mixed to obtain the final composition: novolac resin/quinone diazide type photoresist (18 wt. %), Eu naphthenate (3 wt. %) and acetone (79 wt. %). The photoresist composition was uniformly applied by using a spinner to the surface of a silicon wafer of 4 inches diameter. The coated wafers were then soft baked on a hotplate at 110° C. for 90 seconds. A green radiation ($\lambda$=532 nm), supplied by a frequency doubled Nd:YAG laser, was used to expose at 50 mJ/cm$^2$ the coated wafers. Athereby completing an optical nano-lithography system comprising a photoresist having a quantum multi-photon confinement effect, and a laser directed to the photoresist and adapted to qrite patterns in the photoresist. The Ugra digital scale with lines and space widths of varying size, was used to provide a selective exposure pattern. The imaged wafers were developed in 7 wt. % NaOH solution for 16 seconds. The wafers were rinsed in deionized water and dried by spinning. Pattern images have all the percentages of half-tones of the digital scale.

EXAMPLE 2

A composition was made in the manner of Example 1 except that Eu naphthenate was changed with a mixture of Sm(NO$_3$)$_3$ and Ce(NO$_3$)$_3$. The hydrated lanthanide nitrates were prepared by dissolving the corresponding oxides in 50 wt. % nitric acid and evaporating the solution on a steambath. Sm(NO$_3$)$_3$ and Ce(NO$_3$)$_3$ represents each 1.5 wt. % of the composition. Exposure was decreased to 20 mJ/cm$^2$. The procedure described in Example 1 remained unchanged. Inspection of the developed photoresist pattern confirmed a clear line/space pattern of 50 nm.

EXAMPLE 3

One way to incorporate rare-earth ions into a photoresist is to encapsulate the ions in organic chelates and dope these complexes directly. The complex used in this example was Eu(fod)$_3$ or europium tris(6,6,7,7,8,8,8 heptafluoro-2,2dimethyl-3,5-octanedionate), purchased from Aldrich. One can accomplish doping of photoresist by simply dissolving the RE compound directly into the monomer. The photoresist was doped with 0.7 wt. % europium complex.

Glycidyl methacrylate-allyl glycidyl ether copolymers are prepared by admixing the monomers in a solvent containing the polymerization catalyst after which the reaction mixture is heated to reflux. In a 3000 ml resin flask equipped with a reflux condenser, thermometer, stirrer assembly and addition funnel are placed 360 g of grycidyl methacrylate, 60 g allyl glycidyl ether, 750 ml of methyl ethyl ketone, 2.95 g Eu(fod)$_3$, and 0.982 g of benzoyl peroxide. The reaction solution is stirred while heating to reflux. Upon commencement of refluxing, a solution containing 2.97 g of benzoyl peroxide in 300 ml of methyl ethyl ketone is added slowly from the addition funnel over a period of about 90 minutes. The temperature of reflux is about 88° C. and is maintained, with stirring, over a total refluxing time of 5 hours after which the reaction mixture is permitted to cool to room temperature. Following cooling, 200 ml of additional methyl ethyl ketone is added with stirring after which the solution is filtered and added slowly, to 8 liters of methanol. The precipitated white product is collected and washed thoroughly with methanol after which is it suction dried at room temperature, obtaining 195 g of copolymers. The photoresist was obtained by mixing 5 g of glycidyl methacrylate-allyl glycidyl ether copolymers with 5 g o-chlorotolouene, 44.4 ml of butyronitrile and 0.25 g of 2,5-diethoxy-4-(p-tolylthio) benzene diazonium hexafluorophosphate. Exposure was established to 100 mJ/cm$^2$. The procedure described in Example 1 remained unchanged. The development was carried out in an acetone methyl ethyl ketone solution. As a result, 80 nm lines and space patterns were formed with good shape.

While the invention has been shown and described with reference to certain preferred embodiments thereof, it will be understood by those skilled in the art that various changes in form and details may be made without departing from the spirit and scope of the invention as described hereinabove and as defined by the appended claims.

What is claimed is:

1. A photoresist composition having a quantum multiphoton confinement effect and which is capable of forming an image when exposed to visible light, which comprises:
   (a) about 0.1 to about 10% by weight of a rare earth (RE) complex as a sensitizer in which a rare earth ion is encapsulated by organic ligands, the RE complex sensitizer selected from the group consisting of a RE picolinate, an RE lissamine, a RE(fod)$_3$ wherein fod is 6,6,7,7,8,8,8-heptafluoro-2,2-dimethyl-3,5-octanedionate, a RE(TTA)$_3$ Phen wherein TTA is theonyltrifluoroacetone and Phen is 1,10-phenanthroline, a RE(DBM)$_3$ Phen wherein DBM is dibenzoylmethane and Phen is 1,10-phenanthroline, and a RE fulleride; and
   (b) an ultraviolet, deep ultraviolet or extreme ultraviolet photoresist wherein the RE complex encapsulated by organic ligands is dissolved in the photoresist.

2. The photoresist composition having a quantum multiphoton confinement effect, defined in claim 1 wherein the rare earth in the RE complex is selected from the group consisting of Ce, Pr, Nd, Sm, Eu, Gd, Tb, Dy, Ho, Er, Tm and Yb.

3. The photoresist composition having a quantum multiphoton confinement effect, defined in claim 1 wherein the RE complex is Eu(fod)$_3$.

4. The photoresist composition having a quantum multiphoton confinement effect, defined in claim 1 wherein the photoresist is a positive photoresist.

5. The photoresist composition having a quantum multiphoton confinement effect, defined in claim 4 wherein the positive photoresist is a novolac resin/quinone diazide type photoresist.

6. The photoresist composition having a quantum multiphoton confinement effect, defined in claim 1 wherein the photoresist is a negative photoresist.

7. A method of making the photoresist composition having a quantum multiphoton confinement effect, defined in claim 1 and which is capable of forming an image when exposed to visible light, which comprises:

about 0.1 to about 10% by weight of the RE complex sensitizer in which a rare earth ion is encapsulated by organic ligands; and an ultraviolet, deep ultraviolet or extreme ultraviolet photoresist wherein the RE complex is dissolved in the photoresist, which comprises the steps of:

(a) dissolving an ultraviolet, deep ultraviolet, or extreme ultraviolet photoresist in an organic solvent;

(b) adding and mixing a quantity of the RE complex as a sensitizer in which a rare earth ion is encapsulated by organic ligands, soluble in the organic solvent; and (c) casting the photoresist composition as a film.

8. The method defined in claim 4 wherein the organic solvent is a single organic solvent or a mixture of organic solvents selected from the group consisting of acetone, methyl-ethyl-ketone, cyclohexanone, benzene, chlorobenzene, toluene, glycol ethers, isopropyl alcohol, ethanol and methanol.

9. An optical nanolithography system comprising:

a photoresist having a quantum multiphoton confinement effect;

a rare earth (RE) complex selected from the group consisting of a RE picolinate, a RE lissamine, a RE(fod)$_3$ wherein fod is 6,6,7,7,8,8,8-heptafluoro-2,2-dimethyl-3,5-octanedionate, a RE(TTA)$_3$ Phen wherein TTA is theonyltrifluoroacetone and Phen is 1,10-phenanthroline, a RE(DBM)$_3$ Phen wherein DBM is dibenzoylmethane and Phen is 1,10-phenanthroline, and a RE fulleride as a sensitizer for the photoresist; and at least one laser beam directed at said photoresist and adapted to write patterns to said photoresist.

10. The optical nanolithography system defined in claim 9 wherein the photoresist is an ultraviolet, deep ultraviolet or extreme ultraviolet photoresist with the RE complex as the sensitizer.

11. A method of making a photoresist composition having a quantum multiphoton confinement effect and which is capable of forming an image when exposed to visible light, which comprises:

(a) about 0.1 to about 10% by weight of a rare earth (RE) complex as a sensitizer in which a rare earth ion is encapsulated by organic ligands, the RE complex sensitizer selected from the group consisting of an RE acetylacetonate, a RE picolinate, an RE lissamine, a RE(fod)$_3$ wherein fod is 6,6,7,7,8,8,8-heptafluoro-2,2-dimethyl-3,5-octanedionate, a RE(TTA)$_3$ Phen wherein TTA is theonyltrifluoroacetone and Phen is 1,10-phenanthroline, a RE(DBM)$_3$ Phen wherein DBM is dibenzoylmethane and Phen is 1,10-phenanthroline, and a RE fulleride; and (b) an ultraviolet, deep ultraviolet or extreme ultraviolet photoresist wherein the RE complex encapsulated by organic ligands is dissolved in the photoresist, which comprises the step of incorporating the RE complex sensitizer directly into a monomer phase of an ultraviolet, deep ultraviolet, or extreme ultraviolet polymeric photoresist.

12. The method of making a photoresist composition having a quantum multiphoton confinement effect and which is capable of forming an image when exposed to visible light defined in claim 11 wherein the RE complex sensitizer is a RE acetylacetonate complex.

13. The method of making a photoresist composition having a quantum multiphoton confinement effect and which is capable of forming an image when exposed to visible light defined in claim 11 wherein the RE in the RE complex sensitizer is selected from the group consisting of Ce, Pr, Nd, Sm, Eu, Gd, Tb, Dy, Ho, Er, Tm and Yb.

14. A photoresist composition having a quantum multiphoton confinement effect and which is capable of forming an image when exposed to visible light, which comprises:

(a) about 0.1 to about 10% by weight of a rare earth (RE) salt selected from the group which consists of: naphthenate, stearate, lactate, citrate, and butoxide as a sensitizer; and (b) an ultraviolet, deep ultraviolet or extreme ultraviolet photoresist wherein the RE salt is dissolved in the photoresist wherein the photoresist is a positive photoresist.

15. The photoresist composition having a quantum multiphoton confinement effect and which is capable of forming an image when exposed to visible light defined in claim 14 wherein the positive photoresist is a novolac resin/quinone diazide type photoresist.

16. The photoresist composition having a quantum multiphoton confinement effect and which is capable of forming an image when exposed to visible light defined in claim 14 wherein the RE in the RE salt is selected from the group consisting of Ce, Pr, Nd, Sm, Eu, Gd, Tb, Dy, Ho, Er, Tm and Yb salts.

17. A photoresist composition having a quantum multiphoton confinement effect and which is capable of forming an image when exposed to visible light, which comprises:

(a) about 0.1 to about 10% by weight of a rare earth (RE) salt selected from the group which consists of: stearate, lactate, citrate, and butoxide as a sensitizer; and (b) an ultraviolet, deep ultraviolet or extreme ultraviolet photoresist wherein the RE salt is dissolved in the photoresist wherein the photoresist is a positive or a negative photoresist.

18. The photoresist composition having a quantum multiphoton confinement effect and which is capable of forming an image when exposed to visible light defined in claim 17 wherein the RE in the RE salt is selected from the group consisting of Ce, Pr, Nd, Sm, Eu, Gd, Tb, Dy, Ho, Er, Tm and Yb salts.

\* \* \* \* \*